United States Patent [19]

Huff et al.

[11] Patent Number: 4,918,383

[45] Date of Patent: Apr. 17, 1990

[54] MEMBRANE PROBE WITH AUTOMATIC CONTACT SCRUB ACTION

[76] Inventors: Richard E. Huff, 1408 Solana Dr., Belmont, Calif. 94002; Miklos Perlaki, 1406 Sage Rd., Colfax, Calif. 95713

[21] Appl. No.: 250,458

[22] Filed: Sep. 28, 1988

Related U.S. Application Data

[63] Continuation-in-part of Ser. No. 4,523, Jan. 20, 1987, and a continuation-in-part of Ser. No. 162,763, Mar. 1, 1988.

[51] Int. Cl.⁴ ............................................. G01R 1/067
[52] U.S. Cl. .............................. 324/158 F; 324/158 P; 324/72.5
[58] Field of Search ............... 324/74 R, 158 P, 158 F, 324/72.5

[56] References Cited

U.S. PATENT DOCUMENTS

| | | | |
|---|---|---|---|
| 3,911,361 | 10/1975 | Bove et al. | 324/158 P |
| 4,035,723 | 7/1977 | Kvaternik | 324/158 P |
| 4,151,465 | 4/1979 | Lenz | 324/72.5 |
| 4,636,722 | 1/1987 | Ardezzone | 324/158 F |

*Primary Examiner*—Gerard R. Strecker
*Assistant Examiner*—Edward Urban
*Attorney, Agent, or Firm*—Robert P. Sabath; Edward Y. Wong

[57] ABSTRACT

An apparatus [10] for providing an automatic lateral scrubbing motion when a test membrane [22] engages a device under test (DUT) (not shown). Included are a fixed length flexure pivot assembly [30] and a pair of variable length flexure pivot assemblies [38]. Signal traces, signal trace terminals, and contact bumps [23, 25, 60] are formed for communicating electrical signals between the apparatus [10] and the DUT. A membrane [22] is stretched and configured for carrying the signal traces, signal trace terminals, and contact bumps [23, 25 and 60]. A hexagonal translation stage [28] is formed with an upper surface [29] disposed for being coupled to at lesat one of the fixed and variable length flexure pivot assemblies [30 and 38], and formed with a lower surface [54]. Surface [54] is formed to define an aperture [51] through itself, formed for securing over itself the membrane [22] when stretched; it is disposed for being coupled to membrane [22]. Finally included is a carrier [12], formed for suspending the hexagonal translation stage [28] and fixed and variable length flexure pivot assemblies [30 and 38].

10 Claims, 3 Drawing Sheets

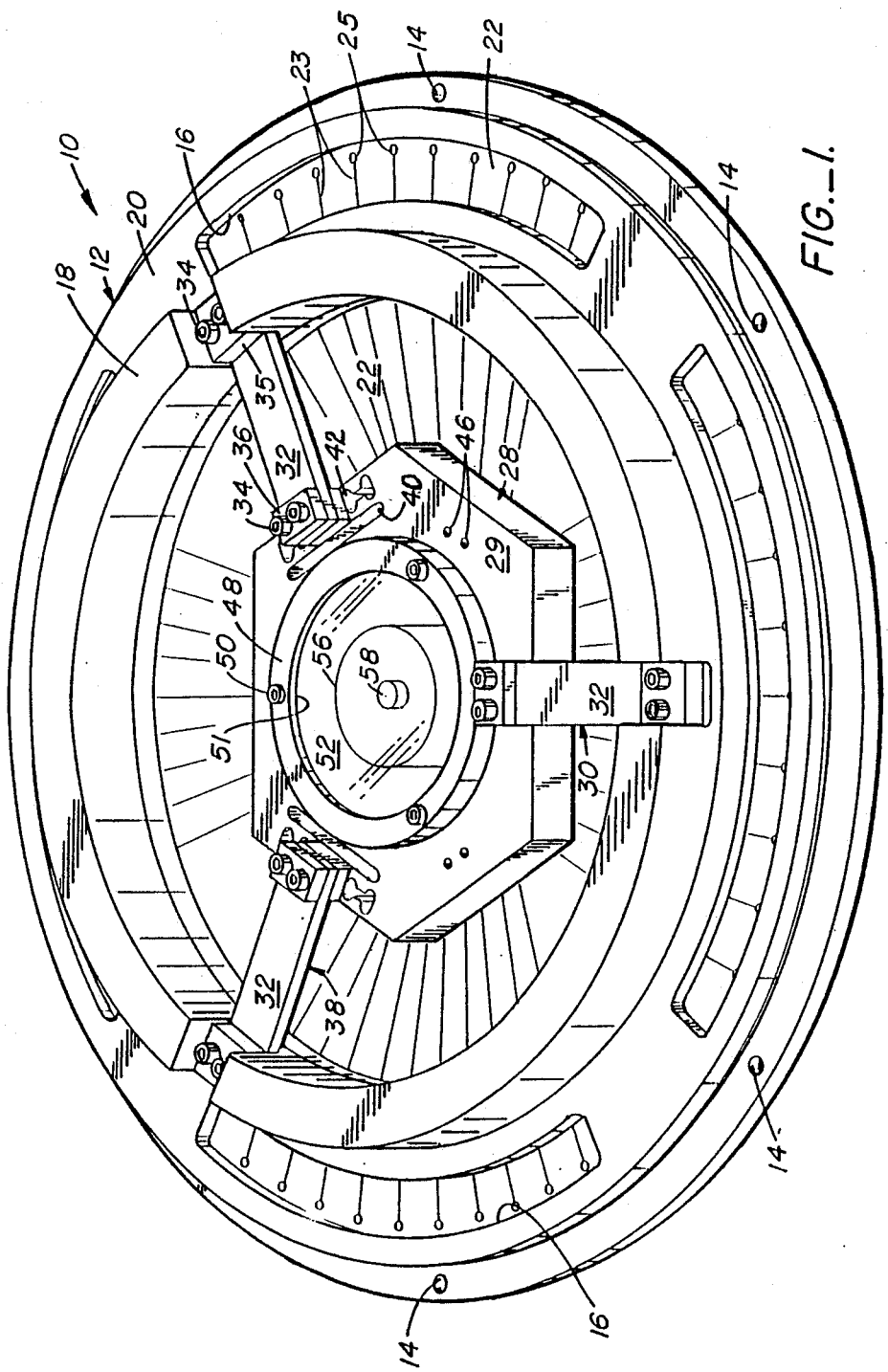
FIG._1.

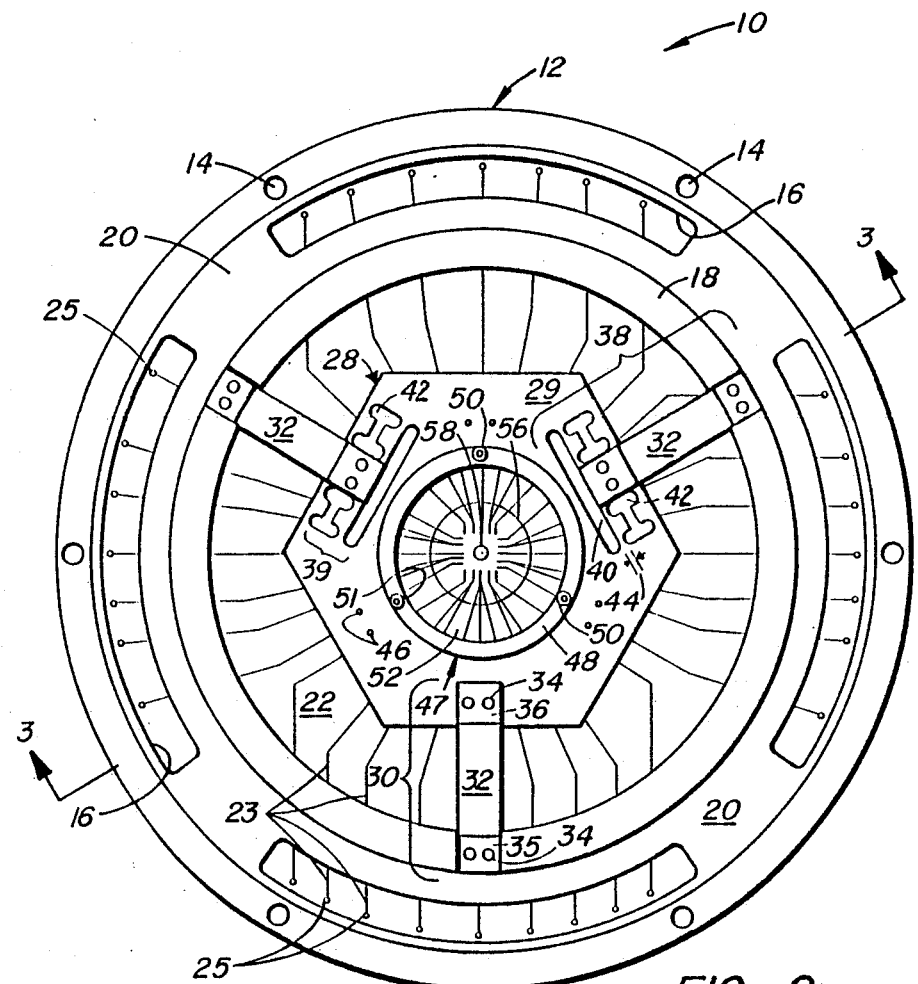
FIG._2.

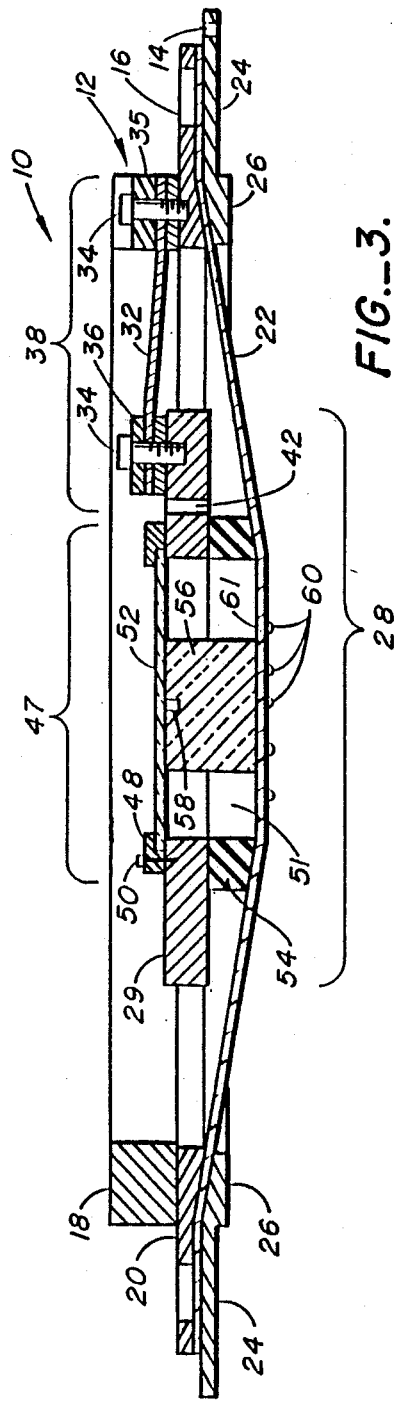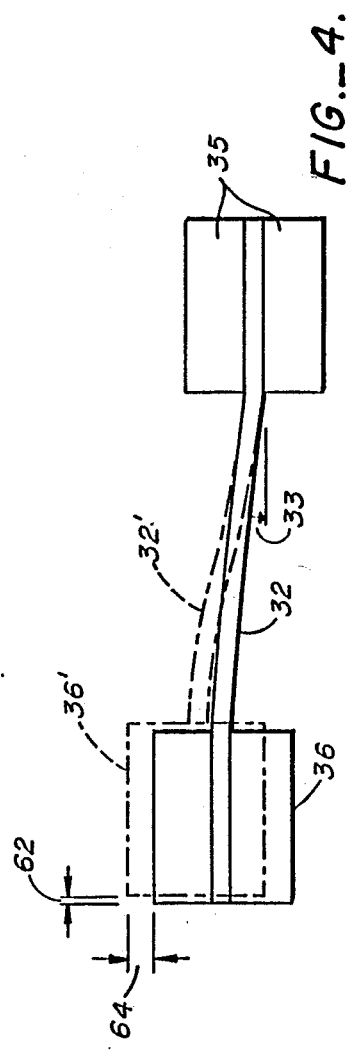

MEMBRANE PROBE WITH AUTOMATIC CONTACT SCRUB ACTION

CROSS-REFERENCE TO RELATED APPLICATIONS

This is a Continuation in-part Application based on the two
following copending parent patent applications: (1) U.S. application Ser. No. 07/004,523, entitled "Test Probe", by Garrettson et al. filed Jan. 20, 1987, and (2) U.S. application Ser. No. 07/162,763, entitled "Membrane-Based IC Test Probe with Precisely Positioned Contacts", by Foster et al., filed Mar. 1, 1988.

Further, this application is also related to two commonly assigned applications entitled (3) "Force Delivery System for Improved Precision Membrane Probe", by Richard Huff and Brian Leslie, filed September 1988, and (4) "Micro-Strip Architecture for Membrane Test Probe", by Elizabeth A. Belloli et al., filed September 1988. These four (4) applications are hereby incorporated by reference.

BACKGROUND OF THE INVENTION

Non-destructive methods for testing integrated circuits are known in the art of semiconductor fabrication. Integrated circuits are generally grown layer by layer into a plurality of many chips dies grouped on thin planar substrates called wafers. Before the wafer is cut into individual chips, the circuitry must be inspected and checked.

Chip circuit testing is usually performed while the chip circuits still reside together on a single wafer, since testing after the dies are sawed apart and packaged is prohibitively expensive. Hundreds of separate chip devices on every wafer are analyzed by passing input signals into each device and monitoring voltage levels at selected output locations.

Conventional probe devices now used often produce inaccurate results because of faulty electrical connections between a test probe and an input/output pad of a chip device under test (DUT). Previous versions of membrane probe test equipment use electrical contacts that are pressed against contact pads on a chip residing on a silicon wafer; these pads are usually made of aluminum.

Aluminum surfaces are usually coated with layers of electrically non-conductive aluminum oxide; these layers are typically five to ten nanometers in depth. This insulative film impairs the capacity of a test probe to accurately and reliably drive high frequency signals into circuitry residing on a wafer.

Problems exist with current technology. Specifically, difficulty has been encountered in providing reliable test systems capable of testing integrated circuits at high speed with while simultaneously maintaining high test accuracy. A major cause of test inaccuracy is the high degree of electrical resistance presented by an oxide film to the flow of electric current.

Therefore, a need exists for the development of an improved membrane test probe which would function well in the face of this oxide resistance.

The invention disclosed here is a test probe system for providing an oxide-abrading scrubbing motion to scrub the contacts residing on a membrane probe card. This probe card is used for supplying high speed test signals to an integrated circuit chip while bundled with other chips on a wafer. This innovative technique improves performance of existing membrane probe card designs by reducing inaccurate test results caused by failure of probe card contacts to make electrical contact with input/output pads of a device under test.

SUMMARY OF THE INVENTION

This invention overcomes the problem of unreliable test results caused by poor electrical contact between a test probe and the input/output pads of a DUT. The invention does this by scrubbing oxide off a contact pad, thereby enabling formation of an effective electrical contact.

This probe uses a translation stage which engages the central portion of a stretched flexible membrane on which are formed conductive signal traces and contact bumps. The perimeter of the membrane is attached to a circular carrier. The translation stage is suspended within the confines of the carrier by one fixed length spring assembly (i.e., a first spring) and a pair of variable length spring assemblies (i.e., a second spring and a third spring), each of which are oriented at 120 degree angles from the other two.

All three assemblies use a leaf spring (i.e., a fourth spring) which extends radially from the periphery of the translation stage to the inner edge of the carrier. These variable length assemblies combine a leaf spring with an expansion spring comprising a cluster of three milled slots which surround the end of a leaf spring near one of the hexagonal of the translation stage. This introduces an asymmetrical structure.

The asymmetry introduced by the combination of a fixed length spring and the twin variable length springs causes a slight but controlled side-to-side lateral scrubbing motion of the translation stage as it moves into contact with a test device (DUT). This side-to-side scrubbing motion results from the disparity in the freedom of motion provided by the fixed and variable length suspension assemblies.

When the translation stage touches down on a wafer, the translation stage first moves vertically and parallel to itself relative to the carrier. The fixed length spring (i.e., the first spring) reacts by rotating upward and pulling the translation stage toward itself. The second spring and third spring react by relaxing to give some slack to the translation stage; as result, the translation stage moves horizontally toward the fixed length spring.

The flexibility or "play" in the suspension system, which enables this small lateral motion, is attributable to the tendency of the translation stage's outer regions to bend toward a radial direction defined by either the second spring or the third spring. This tendency to bend easily in these particular directions is caused by the three milled slots comprising each expansion spring.

BRIEF DESCRIPTION OF THE FIGURES

FIG. 1 shows a cut-away perspective view of a schematic representation of an example construction made according to the invention defined by the claims;

FIG. 2 shows a top view of example construction made according to the claimed invention, wherein a hexagonal translation stage is held over the center of a membrane having electricity conducting signal traces by means of a set of three flexure pivot assemblies suspended from a carrier;

FIG. 3 shows a cross-sectional view of the inventive probe taken along axis 3—3 in FIG. 2, and includes the membrane contact bumps contact a DUT; and FIG. 4 shows the lateral displacement giving the automatic scrubbing motion caused by the interaction of a constant length flexure pivot assembly and a pair of variable length flexure pivot assemblies.

DETAILED DESCRIPTION OF A BEST MODE EXAMPLE EMBODIMENT

The claims define the Invention. This claimed Invention has a broad scope which can be embodied in many different specific example constructions.

In contrast, the Figures, Detailed Description and Abstract illustrate a single example construction made according to the claimed Invention.

Of all the example structures that can be made according to the claims, the inventors consider the particular example structure discussed here to be the best mode example structure for practicing the claimed invention.

System Overview

Broadly stated, this invention offers an apparatus 10 for providing an automatic lateral impingement scrubbing motion when a test membrane 22 of a test probe engages a device under test (DUT) (not shown).

Apparatus 10 comprises a plurality of flexing means 30 and 38 including at least one spring having a fixed length 30 and at least one spring having a variable length 38. Also included is a plurality of electrical conducting means 23, 25, 60, formed for communicating a plurality of electrical signals between a test probe of the apparatus 10 and the DUT.

Apparatus 10 further comprises a flexible planar means such as a membrane 22 which is formed for being stretched and configured for carrying the plurality of electrical conducting means 23, 25 and 60. Also included is a translation means 28, formed with an upper surface 29 disposed for being coupled to at least one of the flexing means 30 and 38 and formed with a lower surface 54.

Surface 54 is formed to define an aperture 51 through itself, aperture 51 being formed for securing over itself flexible planar means 22 when stretched; it is disposed for being coupled to flexible planar means 22. Finally included is a peripheral support means 12, formed for suspending translation means 28 and the plurality of flexing means 30, 38 and 38.

System Detail

FIG. 1 shows a membrane probe 10 bounded by a circular carrier 12 having mounting holes 14 and three circumferential slots 16. An upper ring 18 is mounted on top of the inner edge of carrier 12 and holds a protective layer 20 over a stretched, circular, flexible membrane 22. Membrane 22 is held in place between protective layer 20 and a carrier base 24 that includes a lower ring portion 26 along its inside diameter.

FIG. 2 is a top view of a schematic representation of the an upper surface of membrane 22 carrying a pattern of generally radial conductive signal traces 23. Traces 23 extend to the perimeter of membrane 22 and connect to terminals 25. These terminals are accessed through carrier slots 16. The traces 23 and terminals 25 are omitted from FIG. 1 to simplify the perspective view of the invention.

A hexagonal translation stage 28 is suspended within the center of carrier 12 by three flexure pivot assemblies 30, and 38. One pivot assembly is a fixed length flexure pivot assembly 30 attached to carrier 12 by a leaf spring 32. Spring 32 is clamped between a pair of compression blocks 35 on carrier 12 and by a similar pair of compression blocks 36 on upper surface 29 of translation stage 28.

An attachment angle 33, formed by the intersection of leaf spring 32 and the horizontal plane of the carrier 12, determines the behavior of translation stage 28; angle 33 is explained in detail below. All compression blocks 35 and 36 are connected by screws 34. The second and third flexure pivot assemblies, both labeled 38, are each mounted along a radius which is 120 degrees from the constant length assembly 30.

The hexagonal translation stage is aligned so that each of these three radii formed by the three assemblies 30, 38, and 38 are disposed perpendicular to an edge of the hexagonal perimeter of translation stage 28. Each of the twin variable length flexure pivot assemblies 38 includes a leaf spring 32, two pairs of compression blocks 35 and 36 and their associated screws 34, and further includes a region on the translation stage 28 that behaves as an expansion spring 39.

Each pair of compression blocks 36 is surrounded by three machined channels that comprise expansion spring 39. Each of the two expansion springs 39 includes a transverse slot 40 and an "H" shaped lateral slot 42. Translation stage 28 has two narrow, elongated transverse slots 40 that lie between an edge of the hexagonal perimeter and the center of the translation stage 28. Each of these transverse slots 40 is parallel to a hexagonal edge of the stage 28 and orthogonal to a leaf spring 32.

Lateral slots 42 are cut on both sides of compression blocks 36, and are both adjacent to a trans-verse slot 40 and a hexagonal edge of the translation stage 28. The distance 44 between each transverse slot 40, its width, and its associated pair of lateral slots 42 is a critical parameter that determines the action of the expansion spring 39, which is explained below in detail.

FIG. 3 shows that translation stage 28 also includes several additional pairs of mounting holes 46 for additional flexure pivot assemblies. These holes surround a window assembly 47. Window assembly 47 covers aperture 51. Assembly 47 includes an upper ring 48, a plurality of mounting screws 50, a window 52, and a central transparent disc 56 that extends from window 52 past an insulating lower ring 54 of the translation stage to membrane 22.

Disc 56 has an alignment pin 58 embedded in its top surface that holds disc 56 securely within aperture 51. Window assembly 47 allows the user of the probe 10 to visually align the probe over a wafer on a device under test (not shown).

FIG. 3 also shows a plurality of contact bumps 60 connected through membrane 22 by a plurality of conductive contact bump vias 61. The reader is invited to refer to a commonly-owned and assigned patent application entitled "Micro-Strip Architecture for Membrane Test Probe" by Elizabeth A. Belloli et al. filed July 1988 for a detailed description of the fabrication process used to form signal traces 23, terminals 25, contact bumps 60, and vias 61.

FIG. 4 best illustrates the operation of the membrane probe with automatic contact scrub action 10. Compression blocks 35 and 36 and leaf spring 32 are represented schematically before and after the probe 10 contacts a device under test (not shown). The primed reference numerals 32' and 36' indicate the leaf spring and compression block in deflected positions after contact with a test device.

After translation stage 28 reaches its target, it is pushed upward parallel to itself relative to carrier 12. This lifting force on translation stage 28 causes the stage end of the leaf spring 32 to rotate upwards and pull on translation stage 28. Conversely, when the other two leaf springs 32 deflect, they each allow the entire translation stage 28 to shift slightly in the horizontal plane in a direction parallel to the radius defined by the constant length flexure pivot assembly 30.

FIG. 4 shows that this difference in lateral resilience between the fixed and variable flexure pivot assemblies 30 and 38 generates a slight but controlled side-to-side lateral motion, shown as a displacement distance 62, when stage 28 touches down on a device under test. Displacement 62 is approximately equal to one tenth the vertical travel of translation stage 28.

Due to expansion springs 39, portions of translation stages 28 lying outside transverse slots 40 bend outward toward carrier 12. The narrow, elongated transverse slots 40 and "H" shaped lateral slots 42 on the translation stage present relatively low resistance to bending in directions parallel to the longitudinal axes of the leaf springs 32, but resist torques imposed in other directions.

This torque-resistant characteristic is important because translation stage 28 must be constrained to move along a vertical axis parallel to itself without tilting membrane 22 out of the horizontal plane. Otherwise such tilting would cause misalignment of contact bumps 60 on the device under test.

The spring forces developed by expansion springs 39 are determined by the separation of transverse slots 40 and lateral slots 42; this separation is referred to above as transverse-slot distance 44. As separation 44 is increased, expansion spring 39 becomes stiffer and the reaction to the motion of the translation stage 28 is reduced. The distance across the pair of lateral slots 42 also affects the behavior of the expansion spring 39.

If the distance across slot 42 (in a direction parallel to the length of leaf spring 32) is decreased, then the resistance of expansion spring 39 to bending is decreased. Transverse slot distance 44, selected for the design of the preferred embodiment, is 0.015 inches (0.38 mm). The distance across the lateral slots 42 is typically 0.687 inches (17.45 mm).

The spring force developed by the variable length flexure pivot assemblies 38 in the best mode of the invention is approximately 2500 pounds per inch. Given that spring force, the fixed length flexure pivot assembly 30 must apply a force of two pounds on the translation stage 28 to cause a sideways motion of twenty microns.

The scrubbing action of the flexure pivot assemblies may be set by preloading their spring elements. Another means of controlling the scrubbing behavior of the translation stage is to select a specific angle of attachment for the leaf springs with respect to a horizontal plane defined by base 24 of carrier 12.

For leaf springs 0.375 inches (9.53 mm) long, an 8 degree attachment angle (shown in FIGS. 1 and 3 as reference numeral 33) will result in a scrub distance 62 of about 20 microns in response to a 175 micron displacement of translation stage 28. Setting the scrub motion by altering the attachment angle 33 is easier and more economical than varying the slots 40 and 42 to preload the expansion springs 39.

The resulting scrub action is also more easily controlled by adjusting leaf spring angle 33. Mounting leaf springs 32 at a slight inclination to the horizontal increases the magnitude of the scrub motion in comparison to previous techniques; this mounting also helps to resist undesirable titling of translation stage 28 as it is pushed upward after contact with a test wafer.

In the preferred embodiment of the invention, lower ring 54 on the bottom of translation stage 28 is composed of a material which does not conduct electricity, i.e., a dielectric. A plastic such as Lexan is suitable for this purpose, since it insulates membrane 22 from the metal of the translation stage 28 and also protects the polyimide membrane 22 from abrasion due that may occur when the stage 28 rubs against the membrane 22. The height of translation stage 28 is typically 0.125 inches (3.18 mm).

An alternate embodiment of the present invention may use two or more than three flexure pivot assemblies. Leaf springs 32 may be replaced by any flexible member such as a rod, bar, or coil that can support the translation stage 28 with suitable tension. Similarly, expansion spring 39 is not necessarily constrained to occupy a region of translation stage 28.

Any device which performs the function of introducing asymmetry into the suspension configuration of the translation stage 28 may be used. Expansion spring 39 may be a separate component linking the translation stage 28 to carrier 12 through some equivalent form of spring 32.

In the preferred embodiment described above, the expansion spring 39 comprises three slots milled into stage 28. The shape and placement of these channels may be varied without departing from the spirit and scope of the invention. The contours of the translation stage may also be varied to fit the design of an alternate suspension system.

The membrane probe with automatic contact scrub action is typically used in a stationary chuck while a test wafer is stepped beneath the probe on a moving chuck.

In conclusion, this invention provides a membrane test probe [10] designed for scouring oxides off electrical contact pads, thus enabling formation of an effective electrical contact between the membrane and a semiconductor device under test (DUT) (not shown). A carrier [12] supports a translation stage [28] suspended by three pivot assemblies [30 and 38].

A first pivot assembly, the fixed length flexure pivot assembly [30], includes a leaf spring [32] coupled to carrier [12] by a pair of compression blocks [34]. The second and third pivot assemblies are variable length flexure pivot assemblies [38] combing a leaf spring [32] with a region on an upper surface [29] of the translation stage [28] that acts as an expansion spring [39].

Each expansion spring [39] includes a narrow elongated transverse slot [40] which runs perpendicular to the longitudinal axis of its associated leaf spring [32] and a pair of "H" shaped lateral slots [42] located on either side of the compression blocks [35] on the translation stage [28]. The hexagonal translation stage [28] has a central aperture [51] whose top is covered by a window assembly [47] that includes a window [52] held in place by an upper ring [48].

Window [52] abuts a transparent central disc [56] which resides within the aperture [51] defined by an insulating lower ring [54]. A flexible membrane [22] bearing conductive contact bumps [60] is suspended from the periphery of the carrier [12] and is stretched across aperture [51]. The contact bumps [60] face away from translation stage [28] and are pressed into the input/output pads of a device under test (not shown).

Signals from the device under test are conveyed into the probe [10] via signal traces [23] to terminals [25] which are accessed through slots [16] in a protective layer [20] placed over the membrane [22].

The asymmetry presented by the combination of fixed and variable length flexure pivot assemblies [30, 38] cause the automatic contact scrub motion to occur whenever the test probe [10] is pressed into a device under test. When the translation stage [28] is forced upward when it impacts the device under test through the contact bumps [60], the leaf spring [32] within the fixed length flexure pivot assembly [38] simply deflects upward away from the device under test.

In contrast, leaf springs [32] within the twin variable length flexure pivot assemblies [38] are deformed into an "S" shape due to the action of expansion spring [29] which allows the portion of the translation stage [28] outside the transverse slot [40] to bend toward the carrier [12]. This sideways motion imparts a slight lateral displacement [62] to the travel of translation stage [28] which ultimately causes it to automatically scrub the aluminum contact pad (not shown) on a test device as it makes contact and abrade away its oxide coating.

The membrane probe with automatic contact scrub action is a highly reliable system which will enhance the utility of test equipment used in the semiconductor industry.

Claims Define the Invention

The foregoing Detailed Description gives specific details illustrating only one example of how to practice the much more broadly claimed invention. However, many other specific example structures can be made without departing from the spirit and scope of the appended claims that follow.

Therefore it is to be understood that (a) the Detailed Description narrowly describes a single specific example construction made according to the claims, whereas (b) the claims actually define the invention, the invention defined has a scope much broader than the narrow scope of the specific example described above, and the scope of the claimed invention encompasses many other feasible specific example constructions and equivalent constructions in addition to the one example given above.

The Invention claimed is:

1. An apparatus for providing an automatic lateral impingement scrubbing motion when a test membrane of a test probe engages a device under test (DUT), the apparatus comprising:
   (a) a plurality of flexing means, including:
      (i) at least one spring having a fixed length; and
      (ii) at least one spring having a variable length;
   (b) a plurality of electrical conducting means, formed for communicating a plurality of electrical signals between a test membrane and a DUT;
   (c) a flexible planar means:
      (i) formed for being stretched; and
      (ii) configured for carrying the plurality of electrical conducting means;
   (d) a translation means
      (i) formed with an upper surface disposed for being coupled to at least one of the flexing means; and
      (ii) formed with a lower surface:
         (1) formed to define an aperture through itself, the aperture being formed for securing over itself the flexible planar means when stretched;
         (2) disposed for being coupled to the flexible planar means; and
   (e) a peripheral support means, formed for suspending the translation means and the plurality of flexing means.

2. A membrane probe with automatic scrub action for abrading at least one oxide layer from an input/output pad of a device under test (DUT), the apparatus comprising:
   (a) a first means, comprising a fixed length flexure pivot assembly;
   (b) a second means, comprising a plurality of variable length flexure pivot assemblies;
   (c) a flexible membrane, formed to be stretched;
   (d) a translation stage:
      (i) formed with an upper surface that is coupled to the second means;
      (ii) formed with a lower surface including a penetrating insulating lower ring portion defining an aperture through itself, the aperture being formed for mounting the membrane when stretched, the membrane thus mounted being intended to contact and scrub a pad on the DUT, causing removal of an oxide from the pad; and
   (e) a carrier, coupled to the translation stage by the first means and by at least one of the second means.

3. The apparatus defined in claim 2, wherein: the translation stage has a hexagonal geometry.

4. The apparatus defined in claim 2, wherein the translation stage further comprises:
   (a) a window assembly having an upper ring mounted on the upper surface of the translation stage;
   (b) a window held in place below the upper ring; and
   (c) a transparent central disk held below the window, within the insulating lower ring, and above the membrane.

5. The apparatus defined in claim 2, wherein the fixed length flexure pivot assembly further comprises:
   (a) a leaf spring;
   (b) a first pair of compression blocks mounted on the carrier;
   (c) a second pair of compression blocks mounted on the translation stage.

6. The apparatus defined in claim 2, wherein the variable length flexure pivot assembly further comprises:
   (a) a leaf spring;
   (b) a first pair of compression blocks mounted on the carrier;
   (c) a second pair of compression blocks mounted on the translation stage; and
   (d) an expansion spring formed on the translation stage.

7. The apparatus defined in claim 6, wherein the expansion spring further comprises:
   (a) a pair of "H" shaped lateral slots;
   (b) a narrow transverse slot;
   (c) each of the lateral slots and the transverse slot being positioned to substantially surround the second pair of compression blocks mounted on the translation stage.

8. The apparatus defined in claim 2, wherein the membrane further comprises:

(a) a plurality of signal conducting signal traces having signal trace terminals, the signal traces being formed on an upper side of the membrane to be facing toward the translation stage;
(b) a plurality of contact bumps:
  (i) formed on a lower side of the membrane to be facing away from the translation stage;
  (ii) positioned toward a central portion of the membrane within the insulating lower ring of the translation stage; and
  (iii) electrically coupled through the membrane to the signal traces and the terminals residing on the upper side of the membrane.

9. The apparatus defined in claim 8, wherein the carrier further comprises:

a protective layer:
  (i) placed over the membrane; and
  (ii) formed to have a plurality of slots penetrating the protective layer, the slots providing access to the signal trace terminals on the upper side of the membrane.

10. The apparatus defined in claim 2, wherein: the leaf springs:
  (i) are formed to have a length of approximately 0.375 inches; and
  (ii) are mounted at an intersection angle of approximately 8 degrees with respect to a horizontal plane defined by any two diameters of the circular carrier.

* * * * *